(12) United States Patent
Berglund et al.

(10) Patent No.: US 8,810,004 B2
(45) Date of Patent: Aug. 19, 2014

(54) METHODS, SYSTEMS AND DEVICES FOR ELECTROSTATIC DISCHARGE PROTECTION

(75) Inventors: Stefan Bengt Berglund, Hamburg (DE); Steffen Holland, Hamburg (DE); Uwe Podschus, Adendorf (DE)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/502,807

(22) PCT Filed: Nov. 26, 2009

(86) PCT No.: PCT/IB2009/055357
§ 371 (c)(1),
(2), (4) Date: Apr. 19, 2012

(87) PCT Pub. No.: WO2011/064618
PCT Pub. Date: Jun. 3, 2011

(65) Prior Publication Data
US 2012/0205780 A1  Aug. 16, 2012

(51) Int. Cl.
*H01L 23/62* (2006.01)
*H01L 29/66* (2006.01)
*H01L 29/74* (2006.01)
*H01L 27/02* (2006.01)
*H01L 27/06* (2006.01)
*H01L 29/72* (2006.01)
*H01L 29/73* (2006.01)

(52) U.S. Cl.
USPC ........... 257/577; 257/173; 257/355; 257/356; 257/357; 257/362; 438/133; 438/309

(58) Field of Classification Search
CPC ............ H01L 27/0262; H01L 27/0259; H01L 27/0255; H01L 29/7436; H01L 29/87; H01L 27/0266; H01L 23/60; H01L 27/0251; H01L 29/0692; H01L 29/66386

USPC ........... 361/56, 111; 257/355, 356, 357, 173, 257/362, 107; 438/133, 309

See application file for complete search history.

(56) References Cited

U.S. PATENT DOCUMENTS 4,829,344 A * 5/1989 Bertotti et al. ................ 257/546
5,139,959 A 8/1992 Craft et al.
(Continued)

FOREIGN PATENT DOCUMENTS

EP 0 928 054 A2 7/1999
GB 2 182 490 A 5/1987
(Continued)

OTHER PUBLICATIONS

Data Sheet, PDTC144WT NPN resistor-equipted transistor, May 25, 1999, Philips Semiconductor, pp. 1-7.*
(Continued)

Primary Examiner — Shaun Campbell
Assistant Examiner — Thai T Vuong

(57) ABSTRACT

A resistor-equipped transistor includes a package that provides an external collector connection node (114, 134), an external emitter connection node (120, 140) and an external base connection node (106, 126). The package contains a substrate upon which a transistor (102, 122), first and second resistors, and first and second diodes are formed. The transistor has an internal collector (118, 138), an internal emitter (120, 140) and an internal base (116, 136) with the first resistor (104, 124) being electrically connected between the internal base and the external base connection node and the second resistor (108, 128) being electrically connected between the internal base and the internal emitter. The first and second diodes are electrically connected in series between the external base connection node and the external collector connection node with the first diode (112, 132) having a first cathode-anode orientation that is opposite of a second cathode-anode orientation corresponding to the second diode (110, 130).

20 Claims, 6 Drawing Sheets

(56) References Cited

U.S. PATENT DOCUMENTS

| | | | |
|---|---|---|---|
| 5,528,064 A * | 6/1996 | Thiel et al. | 257/362 |
| 6,563,194 B1 * | 5/2003 | Sakamoto | 257/577 |
| 8,134,815 B2 * | 3/2012 | Dijkhuis et al. | 361/56 |
| 2008/0296684 A1 * | 12/2008 | Nozu | 257/355 |
| 2010/0264457 A1 * | 10/2010 | Sorgeloos et al. | 257/173 |
| 2010/0301389 A1 * | 12/2010 | Kushner et al. | 257/173 |
| 2010/0301418 A1 * | 12/2010 | Kim | 257/360 |
| 2010/0320501 A1 * | 12/2010 | Gendron et al. | 257/173 |
| 2011/0006341 A1 * | 1/2011 | Sawahata | 257/143 |
| 2011/0013326 A1 * | 1/2011 | Ker et al. | 361/56 |
| 2011/0063764 A1 * | 3/2011 | Barrow | 361/56 |
| 2011/0068364 A1 * | 3/2011 | Abou-Khalil et al. | 257/173 |

FOREIGN PATENT DOCUMENTS

| | | |
|---|---|---|
| JP | 62-81053 A | 10/1985 |
| JP | 01-186664 A | 7/1989 |
| WO | 2008/042843 A2 | 4/2008 |

OTHER PUBLICATIONS

Philips Semiconductor; "Data Sheet PDTC144WT NPN Resistor-equipped Transistor"; Product Specification; pp. 1-8 (May 25, 1999) retrieved from the Internet: http://www.datasheetecatalog.org/datasheet/philips/PDTC144WT_3.pdf (Jul. 27, 2010).

International Search Report for application PCT/IB2009/055357 (Aug. 27, 2010).

* cited by examiner

METHODS, SYSTEMS AND DEVICES FOR ELECTROSTATIC DISCHARGE PROTECTION

FIELD OF THE INVENTION

The present invention relates generally to electrostatic discharge protection (ESD), and more specifically, to ESD protection within integrated circuit packages.

BACKGROUND OF THE INVENTION

Integrated circuit packages come in a variety of form factors for an integrated circuit (IC) package. Surface mount device (SMD) standards, such as small-outline (SO) standards, and more specifically small-outline transistor (SOT) standards, define industry standard integrated circuit (IC) form factors, that include Electronic Industries Association of Japan (EIAJ) and Joint Electron Device Engineering Council (JEDEC). SOT's come in several different packages and pinouts. For example, SOT can come in SOT23, SOT457/SC-74, SOT323/SC-70, SOT363/SC-88, SOT416/SC75, SOT666 and SOT883/SC-101. Due to their respectively smaller size, SOTs have less die area. Moreover, package sizes continue to shrink in size and/or to include more functionality within the same package size. This can lead to competing demands between size, power, operating voltages and the like.

SOIC packages can contain various types of discrete devices including, but not limited to, transistors. A specific type of transistor is a bipolar transistor. Bipolar transistors are subject to problems associated with electrostatic discharge (ESD) pulses. ESD pulses can cause extremely high currents and the resulting voltage can damage oxides. For instance, ESD pulses can damage oxides used to insulate IC components. ESD pulses can also damage active or passive IC components made from semiconductor materials such as silicon and polysilicon (e.g., polysilicon resistors).

In a more specific example, ESD pulses have currents that can substantially exceed the normal operating parameters of a transistor, thereby damaging the device. For example, an ESD pulse introduced from the input terminal (connected to the base of the transistor) to the collector terminal or the emitter terminal of the transistor is forced to pass through the transistor. ESD protection continues to present challenges that have not been addressed or often even considered.

SUMMARY OF THE INVENTION

Consistent with an example embodiment of the present invention, a resistor-equipped transistor includes a package that provides an external collector connection node, an external emitter connection node and an external base connection node. The package contains a substrate upon which a transistor, first and second resistors, and first and second diodes are formed. The transistor has an internal collector, an internal emitter and an internal base with the first resistor being electrically connected between the internal base and the external base connection node and the second resistor being electrically connected between the internal base and the internal emitter. The first and second diodes are electrically connected in series between the external base connection node and the external emitter connection node with the first diode having a first cathode-anode orientation that is opposite of a second cathode-anode orientation corresponding to the second diode.

The above summary is not intended to describe each embodiment or every implementation of the present disclosure. The figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which.

Figure 1B:
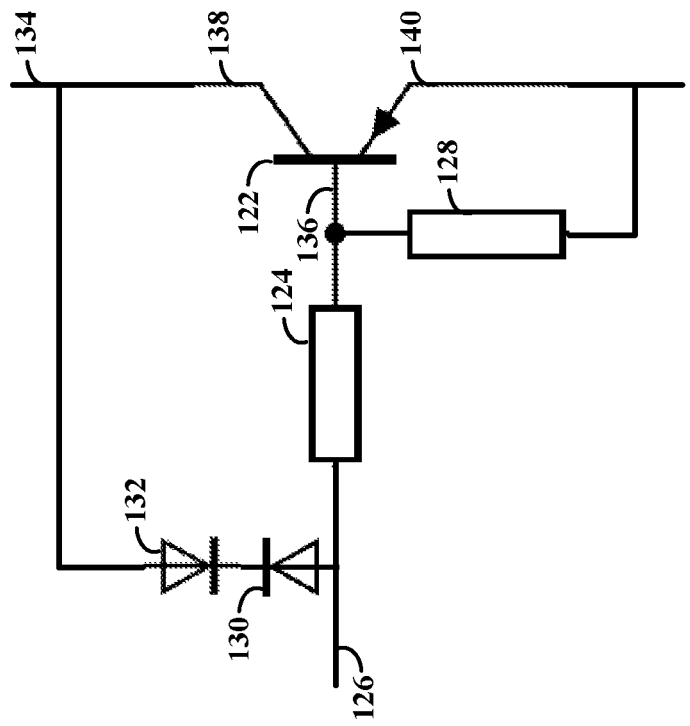
FIG. 1B shows a circuit diagram of a resistor equipped transistor, according to another example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined by the appended claims.

DETAILED DESCRIPTION OF THE EMBODIMENTS

The present invention is believed to be applicable to a variety of different types of processes, devices and arrangements for use with surface mount device (SMD) packages. While the present invention is not necessarily so limited, various aspects of the invention may be appreciated through a discussion of examples using this context.

Embodiments of the present invention relate to integrated electrostatic discharge (ESD) protection for ICs. The IC operates to provide a desired function, such as a transistor function with integrated (polysilicon) resistive elements. The components of the IC are protected by diode(s) that shunt ESD pulses away from sensitive components of the IC.

In various implementations, the IC is designed with particular operational limitations. These limitations can include, for example, acceptable voltage ranges, breakdown voltages and current limitations. The protection circuitry is designed so as to maintain the particular operational limitations while also providing significant ESD protection ratings. Example design constraints are discussed in more detail herein.

In a particular implementation, the IC is packaged in a small-outline integrated circuit (SOIC) or similar package. The resistor(s) are designed to provide a built in resistance for the IC. This function is generally to provide built-in bias resistance for a transistor. For instance, the resistor(s) can be implemented using a material/process that provides sufficient sheet resistance to allow for placement within the SOIC-sized package, and in a particular implementation, on the same substrate as the sensitive components of the IC. The diode(s) are designed to provide ESD protection by shunting current away from the sensitive components of the IC for high-voltages commonly associated with ESD pulses. This shunting occurs in response to reverse breakdown of the diode(s). The diode(s) are designed to minimally affect the functional parameters of the device. For example, reverse current for the diode(s) is virtually non-existent up until the breakdown voltage. Thus, proper selection of the breakdown voltage can limit the effect of the diode(s) on the function of the device, as discussed in more detail herein.

According to one embodiment of the present invention, the multiple resistors are used in combination with multiple diodes. This is particularly useful for transistor-based ICs. A first resistive element is placed between an external base pin and the internal base of the transistor. A second resistive element is placed between the internal base of the transistor and an external emitter pin. These resistive elements are designed to provide bias voltages for the transistor elements. These resistive values can be designed for a variety of applications and based upon various factors (e.g., internal capacitance and safe voltage range). Example resistor values are on the order of 1 ktΩ-100 kΩ. Two diodes are connected between the external base pin and the external collector pin. These diodes are connected in a back to back format (i.e., a series connection with oppositely directed cathode-anode orientations). In this manner, essentially no current flows through the diode-created electrical path during normal operation. The diodes are, however, designed so that they enter reverse breakdown when the voltage on the base exceeds the operating voltage for the transistor. This allows current to be shunted away from the base when a potentially dangerous ESD pulse is applied thereto. In one embodiment, the diodes are implemented using a transistor. For instance, the base of the transistor can be left floating so that the transistor forms and functions as the diodes.

The particular combination of resistors and diodes has been found particularly useful for small IC packages (e.g., SOIC). For instance, many desirable resistance values for the first and second resistors require a reasonably high sheet resistance (e.g., greater than about 100 Ohm/square) due in part to limits in the die/package size. Accordingly, these resistors are often made from a material such as polysilicon. Aspects of the present invention, however, relate to the recognition of polysilicon resistors as a weak point for ESD failures. For instance, due to the temperature coefficient of polysilicon, the resistance of polysilicon is lowered when temperature rises. When an ESD pulse is applied to the resistor the resulting current flow causes the resistor to heat, which lowers the resistance and further increases the current density within the resistor. Moreover, this heating can cause a current crowding effect where current flow is concentrated within a narrow portion of the resistor. Therefore, the current of an ESD pulse has the tendency to increase the current and to cause local overheating, which can damage the device. Recognizing that the resistive elements can be the limiting factor in ESD protection rating, a back to back protection diode solution is implemented that provides ESD protection for the resistor equipped transistor that allows for bypassing of such weak resistors.

Recognizing the problem associated with the (polysilicon) resistors, embodiments of the present invention allow for integration of diode-based protection into a small form factor package. Particular embodiments use a common substrate for the transistor and diodes as well as sharing of a terminal (anode or cathode) between the diodes. Aspects of the present invention are particularly useful for applications requiring high ESD protection levels. One such application is in the automotive industry, although the invention is not so limited. Various embodiments of the present invention allow for significant increases in the ESD protection levels by shunting ESD-related current through the diodes.

A particular implementation of the present invention is directed towards a resistor equipped transistor (e.g., PDTC114e series RET offered by NXP semiconductors). A resistor equipped transistor (RET) includes a vertical NPN or PNP transistor and a first lateral resistor that connects an external base terminal with the internal base of the transistor. A second lateral resistor is connected between the transistor internal base and the external/internal emitter terminal of the NPN transistor. Two back-to-back protection diodes provide ESD protection. The back-to-back diodes connect the input terminal with the output terminal (collector of the NPN transistor) in such a way that they do not affect the transistor during normal operating conditions (e.g., one of the diodes operates in reversed bias condition), but bypass (e.g., one of the diodes operates in a reverse breakdown condition) the current past the resistors in case of an ESD pulse.

Aspects of the present invention are particularly well-suited to the integration of such a back to back protection solution under the base bond pad of a standard resistor equipped transistor without disturbing the normal transistor limiting values (e.g., transistor breakdown voltages specification for collector-emitter breakdown voltage with base open ($BV_{CEO}$), collector-base breakdown voltage with base open ($BV_{CBO}$) and specified input voltage range ($V_{IN}$)). Particular embodiments are directed toward a device having an ESD class greater than 1 kV and to back to back diodes that are designed so as not reach breakdown within the specified input voltage range and the transistor breakdown voltages, but to reach breakdown at voltages only slightly higher than the specified input voltage range.

Aspects of the present invention also relate to diodes specifically designed to mitigate the effect the diodes have on the functionality of the RET. This includes setting the reverse breakdown voltage of the diodes to a level that is outside of the operating voltage of the transistor. If a voltage gap exists between the reverse breakdown voltage of the diodes and the operating voltage of the RET, the transistor and the resistors are subject to voltage levels outside of the operating range. For example, the operating voltage of the RET could be defined with a collector-base breakdown voltage with base open ($BV_{CBO}$) of 50 V. If the reverse breakdown voltage of the diode was 60 V, then the RET would be exposed to a voltage of up to about 60 V during an ESD pulse. In certain embodiments the diodes are designed so that the breakdown voltage is set close to the operating voltage of the transistor. To avoid overlap between the breakdown voltage and the operating voltage, part tolerances (e.g., due to process variances) are considered when determining the proper breakdown voltage levels for the diodes.

Diodes with specific operational parameters can be implemented by varying a number of factors. These parameters can include, but are not necessarily limited to, reverse breakdown voltages and/or maximum current limits. Reverse break-down voltage of the diodes can be set by controlling the doping concentration of one or more of the N or P junctions that form the NP junction of the diode. Other contributing factors can include gradient concentrations, size of the NP junction and the like. A particular implementation of the present invention provides 60V reverse break down voltage with a maximum doping concentration of 8e15 cm$^{-3}$ on the cathode side of the diodes.

Figure 1A:
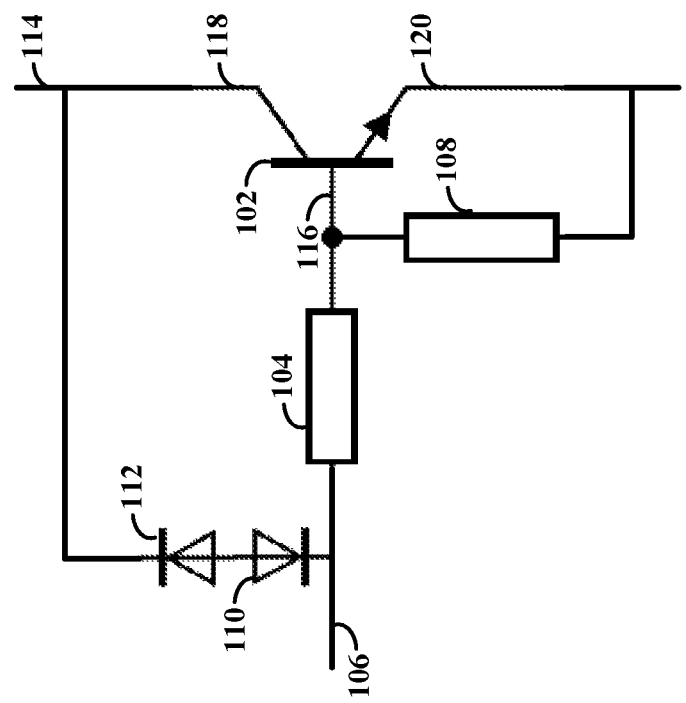
FIG. 1A shows a circuit diagram of a resistor equipped transistor, according to an example embodiment of the present invention.

Turning now to the figures, FIG. 1A shows a circuit diagram of a resistor equipped transistor, according to an example embodiment of the present invention. The resistor equipped transistor includes a vertical NPN Transistor 102 and a first lateral resistor 104 connecting an external input terminal 106 with the internal base 116 of the transistor 102. The external input terminal 106 is a low resistive connection to an external pin. A second lateral resistor 108 is connected between the internal transistor base 116 and the emitter 120 of the transistor 102. In one implementation, the resistors 104 and 108 are polysilicon resistors. Two back-to-back protection diodes 110 and 112 are connected between the input terminal 106 and external output terminal 114 (collector 118 of the transistor 102). In this instance, the external output terminal 114 and the internal collector 118 of the transistor 102 are in common. The cathode of diode 112 is connected to the output terminal 114 and the cathode of diode 110 is connected to the input terminal 106. In one implementation, the diodes 110 and 112 share a common anode. The diodes 110 and 112 are designed such that the normal function of the transistor 102 is not disturbed. For example, the diodes 110 and 112 do not reach breakdown within the specified input voltage range provided to the input terminal 106 and breakdown voltages $BV_{CEO}$ and $BV_{CBO}$. The breakdown voltage of the diodes 110 and 112 is selected to be just higher than the specified input voltage range and higher than the breakdown voltages of the transistor.

The diodes 110 and 112 do not affect the operation of the transistor 102 during normal operating conductions, while providing ESD protection for the transistor 102. For example, when a positive or negative ESD pulse occurs between the input (base) terminal 106 and the output (collector) terminal 114 (B-C) a low resistive path, compared to the path over resistor 104 (e.g., less than 1 kΩ), opens through the diodes 110 and 112. As another example, when a positive or negative ESD pulse occurs between the input (base) terminal 106 and the emitter 120 of transistor 102 (B-E) a low resistive path, compared to the greater than the path over resistor 104 (e.g., less than 1 kΩ), opens over the diodes 110 and 112 and the transistor C-E. An ESD pulse from the output terminal 114 (collector of transistor 102) to GND (emitter 120 of transistor 102) C-E, is normally uncritical compared to B-E and B-C.

FIG. 1B shows a circuit diagram of a resistor equipped transistor, according to another example embodiment of the present invention. The resistor equipped transistor includes a vertical PNP transistor 122 and a first lateral resistor 124 connecting an external input terminal 126 with the internal base 136 of the transistor 122. A second lateral resistor 128 is connected between the transistor base 136 and the emitter 140 of the transistor 122. Two back-to-back protection diodes 130 and 132 are connected between the input terminal 126 and external output terminal 134 (collector 138 of the transistor 122). The anode of diode 132 is connected to the output terminal 134 and the anode of diode 130 is connected to the input terminal 126. In one implementation, the diodes 130 and 132 share a common cathode. The diodes 130 and 132 are designed such that the normal function of the transistor 122 is not disturbed, as discussed above in connection with the operation of transistor 102 of FIG. 1A.

FIGS. 2-4 show cross-sections of different resistor equipped transistors at various steps of manufacturing, consistent with embodiments of the present invention. The resistor equipped transistors depicted in FIGS. 2-4 can be configured to function according to the circuit layout shown in FIGS. 1A and 1B. These figures depict NPN and PNP transistor implementations; however, the respective processes of forming the transistors are discussed in terms of an NPN transistor. The discussed processes are applicable to the formation of a PNP transistor circuit consistent with the circuit depicted in FIG. 1B. For instance, a PNP transistor can be implemented by swapping the n and p type regions as is shown in FIGS. 2-4 by the "/" located between the respective doping types.

Figure 2A:
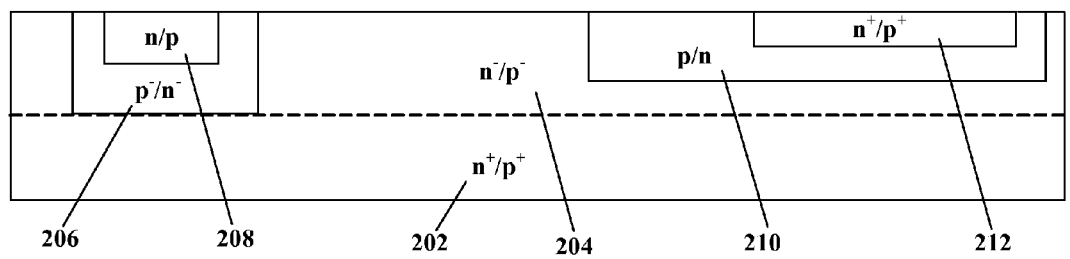
FIGS. 2A-2C show a cross-section of a resistor equipped transistor at various manufacturing steps, according to an example embodiment of the present invention.
Figure 2B:
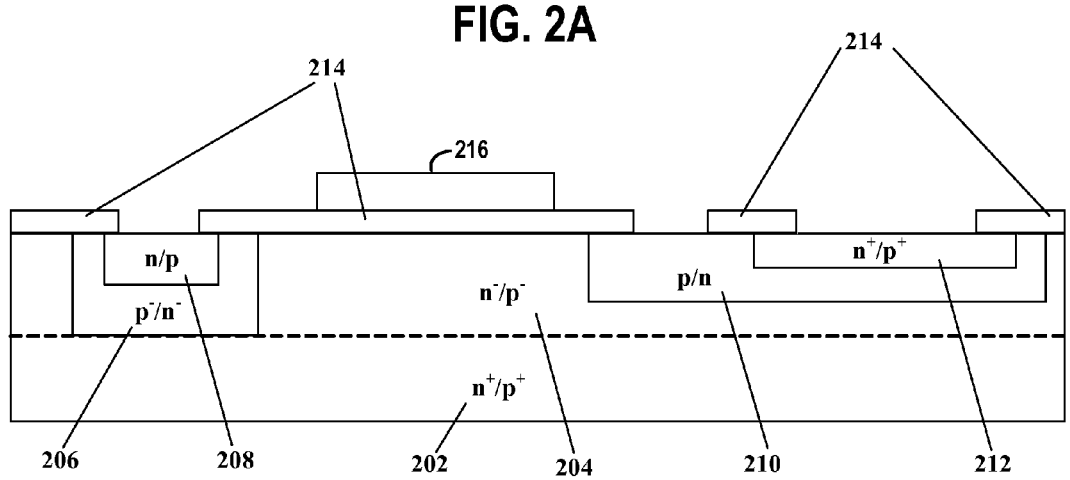
Figure 2C:
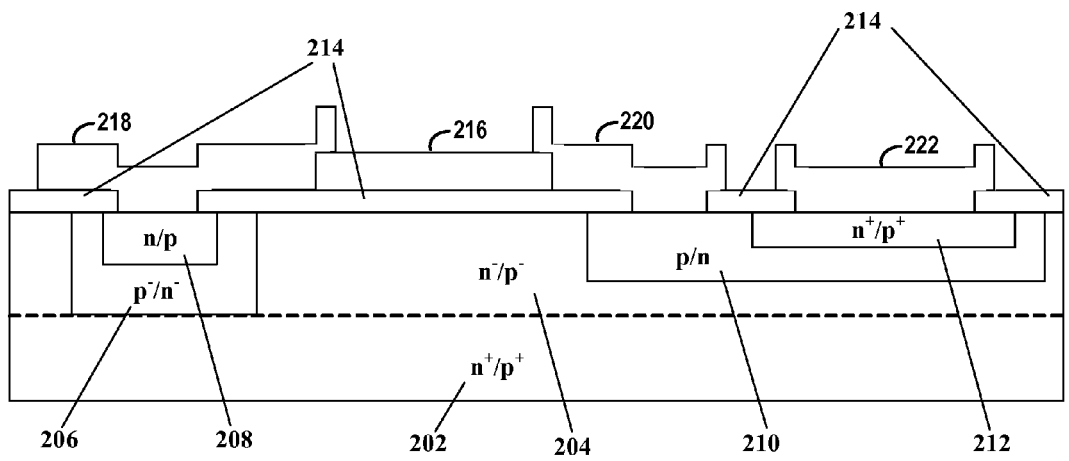

FIGS. 2A-2C show a cross-section of a resistor equipped transistor at various manufacturing steps, according to an example embodiment of the present invention. As shown in FIG. 2A, an n$^+$ substrate 202 is provided, which forms the cathode of the first diode (e.g., diode 112 of FIG. 1A). For a PNP device, the p$^+$ substrate 202 forms the anode of the first diode (e.g., diode 132 of FIG. 1B). An n$^-$ epitaxial layer 204 is grown on the substrate 202. The epitaxial layer 204 forms the collector of the transistor (e.g., transistor 102 of FIG. 1A). For a PNP device, a p$^-$ epitaxial layer 204 is grown on the substrate 202 thereby forming the collector of the transistor (e.g., transistor 122 of FIG. 1B). In then epitaxial layer 204, a p$^-$ region 206 is implanted. This implantation can be used to drive the p- region almost to the substrate 202. The p$^-$ region 206 forms the common anode of the first and second diodes. For a PNP device, n$^-$ region 206 is implanted in p$^-$ epitaxial layer 204 to form the common cathode of the first and second diodes.

In the p$^-$ region 206, an n region 208 is implanted and driven in to form the cathode of the second diode (e.g., diode 110 of FIG. 1A). For a PNP device, a p region 208 is implanted in n$^-$ region 206 to form the anode of the second diode (e.g., diode 130 of FIG. 1B).

Subsequently, a p region 210 is implanted in the epitaxial layer 204 to form the base of the transistor and an n$^+$ region 212 is implanted in p region 210 to form the emitter of the transistor. In one implementation, the base 210 and the emitter 212 of the transistor can be formed prior to the formation of the common anode 206 of the first and second diodes and the cathode of the second diode. In another implementation, the base 210 is formed as part of the same processing step(s) that form the common anode 206 and/or the emitter 212 is formed as part of the same processing step(s) that form the cathode 208 of the second diode.

After formation of the diodes and the transistor, an oxide layer 214 is formed on the surface of the device, as shown in FIG. 2B. In one implementation, the oxide layer is a deposited oxide layer such as silicon dioxide. A layer of polysilicon is then deposited on top of the oxide layer 214. The polysilicon layer is patterned to form the first and second resistors (e.g., resistors 104 and 108 of FIG. 1A), with the first resistor 216 shown in FIG. 2B. In one implementation, the polysilicon layer is patterned using any suitable dry or wet etching process. The oxide layer 214 is patterned to expose openings to the cathode 208 of the second diode and to the base 210 and the emitter 212 of the transistor. As with the polysilicon layer, the oxide layer 214 can be patterned using any suitable dry or wet etching process.

After patterning of the polysilicon layer, a metal layer is deposited on the surface of the device, as shown in FIG. 2C. The metal layer can be any metal, for example aluminium, that is suitable for forming interconnects between the various components of the device. The metal layer is then patterned to form base bond pad 218, which serves as the external input terminal for the device and also connects the cathode 208 of the second diode to the first resistor 216. The base bond pad 218 is located above the first and second diodes. The patterning of the metal layer also forms metal interconnect 220, which serves as an internal connection that connects the first resistor 216 to the base 210 of the transistor, and metal interconnect 222, which connects the emitter 212 of the transistor to the second resistor (not shown).

Figure 3A:
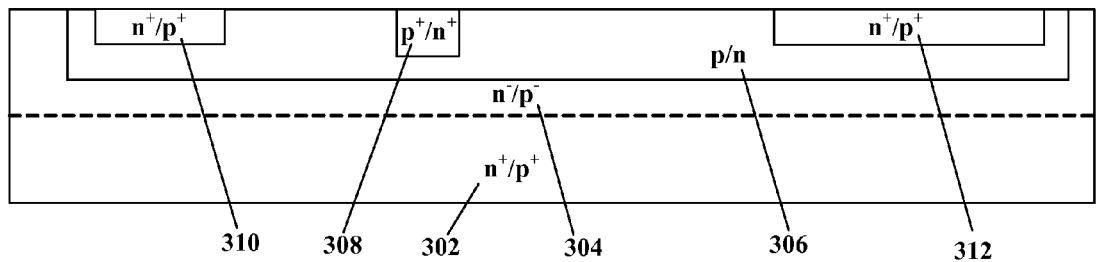
FIGS. 3A-3C show a cross-section of a resistor equipped transistor at various manufacturing steps, consistent with another embodiment of the present invention.
Figure 3B:
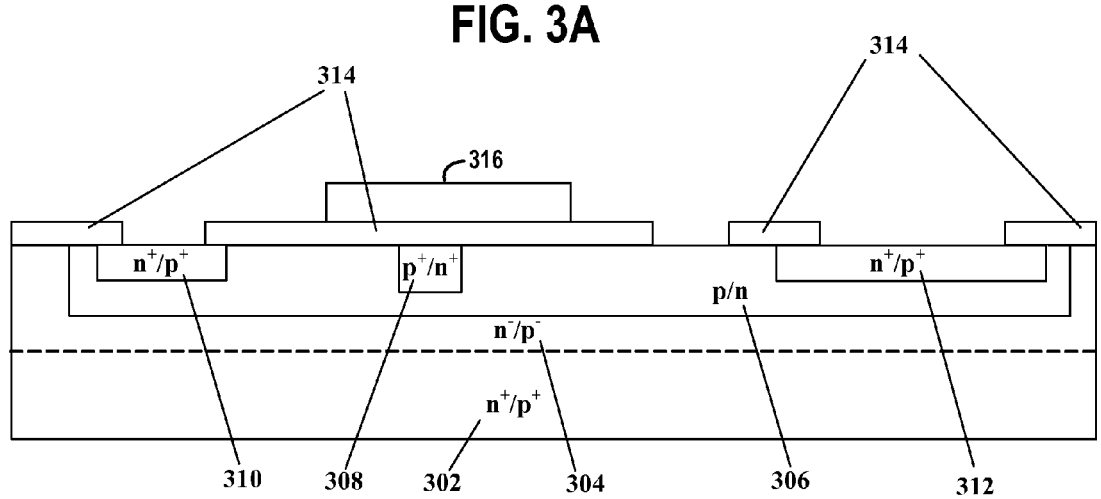
Figure 3C:
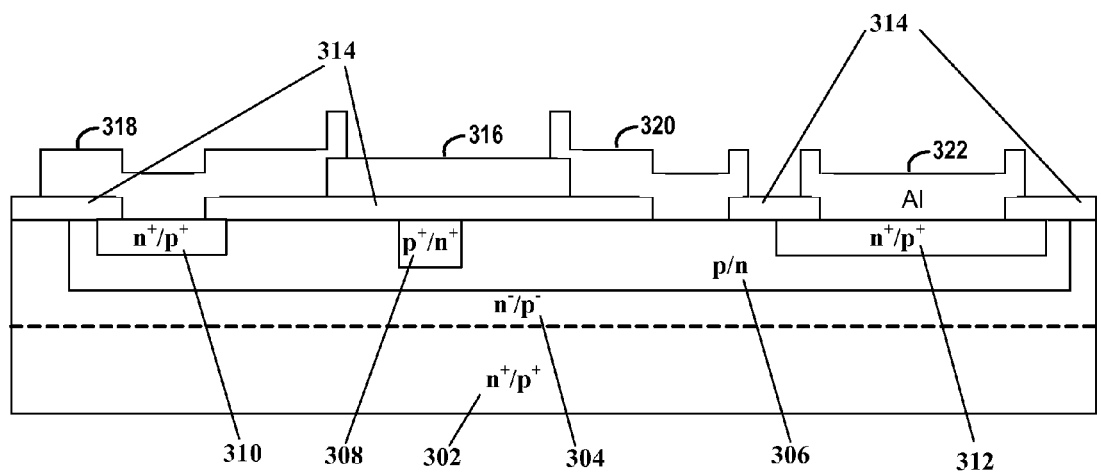

FIGS. 3A-3C show a cross-section of a resistor equipped transistor at various manufacturing steps, according to another example embodiment of the present invention. As shown in FIG. 3A, an $n^+$ substrate 302 is provided. An $n^-$ epitaxial layer 304 is grown on the substrate 302. Then $n^-$ epitaxial layer 304 forms the cathode of the first diode (e.g., diode 112 of FIG. 1A) and the collector of the transistor (e.g., transistor 102 of FIG. 1A). For a PNP device, a $p^-$ epitaxial layer 304 is grown on the substrate 302 thereby forming the anode of the first diode (e.g., diode 132 of FIG. 1B) and the collector of the transistor (e.g., transistor 122 of FIG. 1B). A p region 306 is implanted and driven in to the $n^-$ epitaxial layer 304. This p region 306 forms the base of the transistor and the common anode of the first and second diodes. For a PNP device, an n region 306 is implanted in $p^-$ epitaxial layer 304 to form the base of the transistor and the common cathode of the first and second diodes. In the p region 306, a $p^+$ well 308 is implanted and diffused. In one implementation, the step of forming the $p^+$ well 308 can be omitted if, for example, the distance between the diodes and the transistor is large enough to inhibit leakage current. Two $n^+$ regions 310 and 312 are implanted and diffused in the p region 306. The $n^+$ region 310 forms the cathode of the second diode (e.g., diode 110 of FIG. 1A) and the $n^+$ region 312 forms the emitter of the transistor. For a PNP device, two $p^+$ regions 310 and 312 are implanted to form the anode of the second diode (e.g., diode 130 of FIG. 1B) and the emitter of the transistor.

After formation of the diodes and the transistor, an oxide layer 314 is deposited on the surface of the device, as shown in FIG. 3B. A layer of polysilicon is then deposited on top of the oxide layer 314. The polysilicon layer is patterned to form the first and second resistors (e.g., resistors 104 and 108 of FIG. 1A), with the first resistor 316 shown in FIG. 3B. The oxide layer 314 is patterned to expose openings to the cathode 310 of the second diode and to the base 306 and the emitter 312 of the transistor. After patterning of the polysilicon layer, a metal layer is deposited on the surface of the device, as shown in FIG. 3C. The metal layer is then patterned to form base bond pad 318, which serves as the external input terminal for the device and also connects the cathode 310 of the second diode to the first resistor 316. The base bond pad 318 is located above the first and second diodes. The patterning of the metal layer also forms metal interconnect 320, which serves as an internal connection that connects the first resistor 316 to the base 306 of the transistor, and metal interconnect 322, which connects the emitter 312 of the transistor to the second resistor (not shown).

Figure 4A:
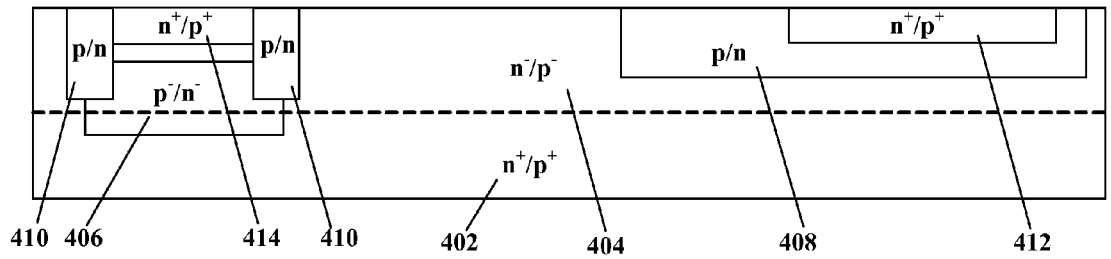
FIGS. 4A-4C show a cross-section of a resistor equipped transistor at various manufacturing steps, according to further example embodiment of the present invention.
Figure 4B:
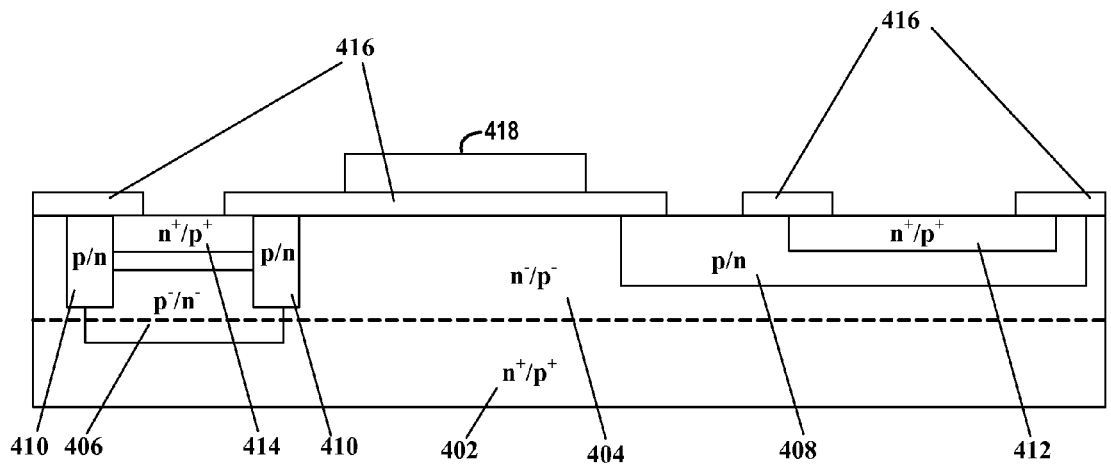
Figure 4C:
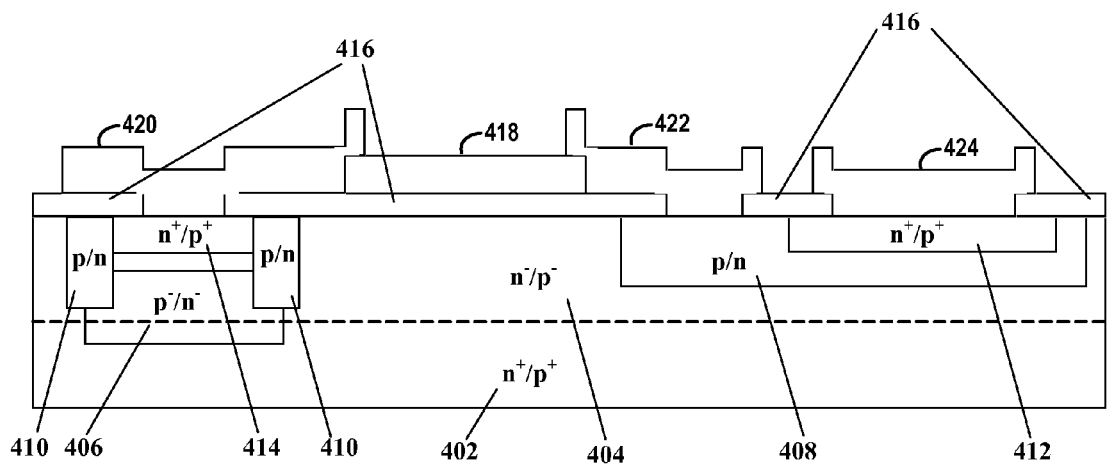

FIGS. 4A-4C show a cross-section of a resistor equipped transistor at various manufacturing steps, according to an example embodiment of the present invention. As shown in FIG. 4A, an $n^+$ substrate 402 is provided, which forms the cathode of the first diode (e.g., diode 112 of FIG. 1A). Part of an n epitaxial layer 404 is grown on the substrate 402. The epitaxial layer 404 forms the collector of the transistor (e.g., transistor 102 of FIG. 1A). A buried $p^-$ layer 406 is implanted into the part of then epitaxial layer 404. The buried $p^-$ layer 406 forms the common anode of first and second diodes. For a PNP device, a buried $n^-$ region 406 is implanted to form the common cathode of the first and second diodes. After the formation of the buried $p^-$ layer 406, the rest of the $n^-$ epitaxial layer 404 is grown. In the $n^-$ epitaxial layer 404, two p regions 408 and 410 are implanted and driven in, respectively forming the base of the transistor and the isolation of the second diode. In one implementation, the two p regions 408 and 410 are formed during a single processing step. In the p region 408 and in then region 404, two $n^+$ regions 412 and 414 are implanted and driven in, respectively forming the emitter of the transistor and the cathode of the second diode (e.g., diode 110 of FIG. 1A). In one implementation, the two $n^+$ regions 412 and 414 are formed during a single processing step. For a PNP device, the $p^+$ region 414 forms the anode of the second diode (e.g., diode 130 of FIG. 1B).

After formation of the diodes and the transistor, an oxide layer 416 is deposited on the surface of the device, as shown in FIG. 4B. A layer of polysilicon is then deposited on top of the oxide layer 416. The polysilicon layer is patterned to form the first and second resistors (e.g., resistors 104 and 108 of FIG. 1A), with the first resistor 418 shown in FIG. 4B. The oxide layer 416 is patterned to expose openings to the cathode 414 of the second diode and to the base 408 and the emitter 412 of the transistor. After patterning of the polysilicon layer, a metal layer is deposited on the surface of the device, as shown in FIG. 4C. The metal layer is then patterned to form base bond pad 420, which serves as the external input terminal for the device and also connects the cathode 414 of the second diode to the first resistor 418. The base bond pad 420 is located above the first and second diodes. The patterning of the metal layer also forms metal interconnect 422, which serves as an internal connection that connects the first resistor 418 to the base 408 of the transistor, and metal interconnect 424, which connects the emitter 412 of the transistor to the second resistor (not shown).

Figure 5:
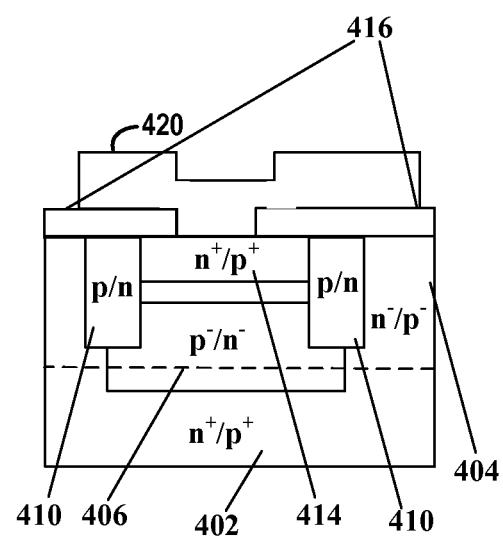
FIG. 5 shows a back to back diode configuration for integration with a resistor equipped transistor, according to an example embodiment of the present invention.

FIG. 5 depicts a back to back diode configuration for integration with a RET transistor in a SOIC package. This back to back diode can be implemented as a discrete device that is placed within the same package as a RET transistor and connected consistent with FIGS. 1A or 1B. This can be particularly useful for allowing different manufacturing processes to be implemented for the transistor and the diodes. For instance, the diodes can be implemented using an epitaxially grown concentration layer 404 that has a different doping concentration with respect to the RET transistor. Another possible variation is to use a substrate having an opposite doping relative to the transistor substrate (e.g., n vs. p). In this manner a single diode configuration can be used for either NPN or PNP transistors.

This back to back diode is depicted using a configuration similar to that resulting from FIG. 4 as indicated by the common numbering. The invention, however, is not so limited, and variations of this configuration are possible including implementations that are consistent with FIGS. 2 and 3.

Figure 6:
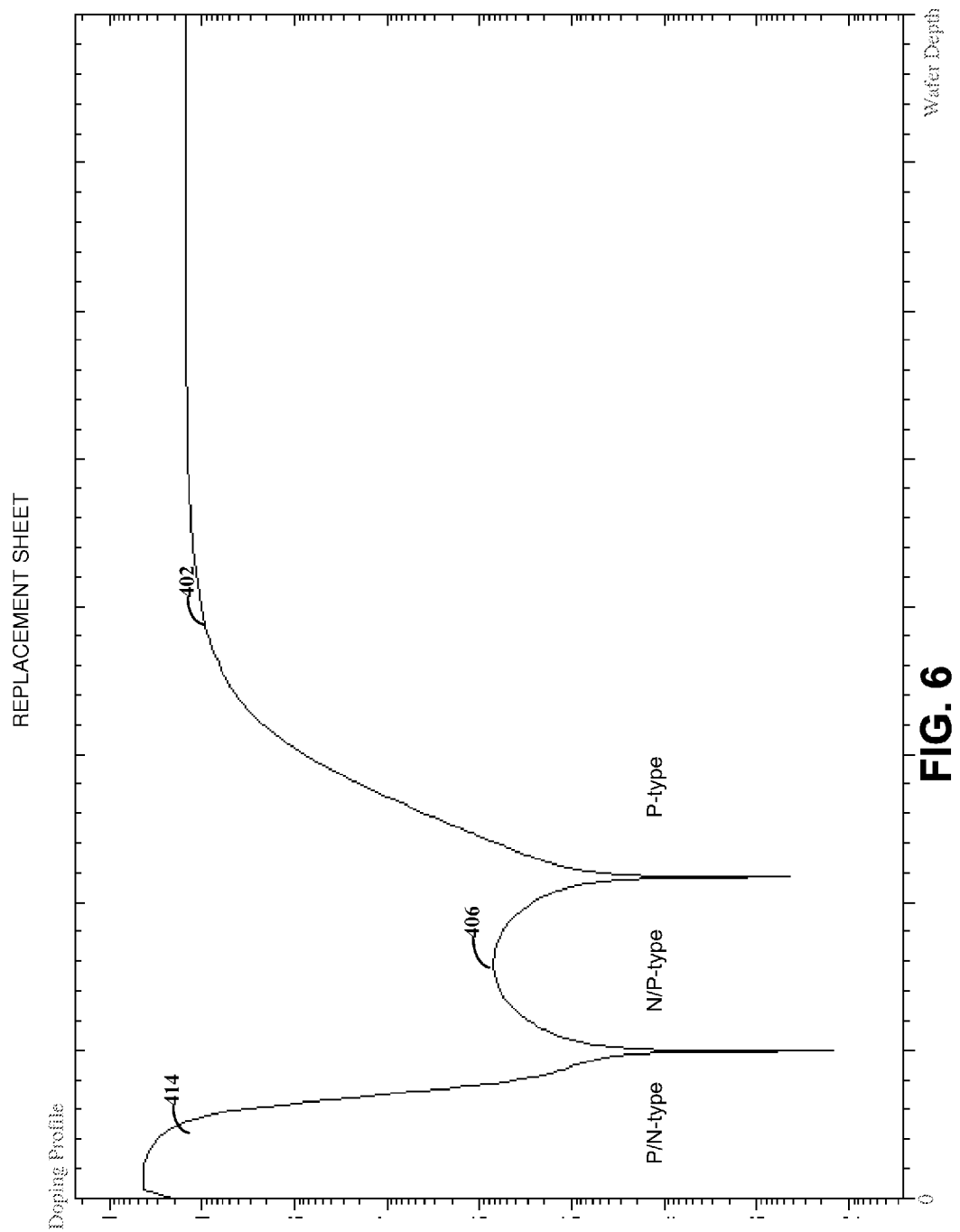
FIG. 6 shows a doping profile for portions of a resistor equipped transistor, according to an example embodiment of the present invention.

FIG. 6 depicts an example doping profile for portions of a resistor equipped transistor, according to an example embodiment of the present invention. The example doping profile illustrated in FIG. 6 is for a device similar to that resulting from the process of FIG. 4 as indicated by the common numbering. The doping profile of FIG. 6 is a vertical doping profile starting at the surface of the region 414, which forms either the anode or the cathode of the second diode, and extending through the epitaxial layer 404 into substrate 402. The doping profile of FIG. 6 can be varied so as to maintain the particular operational limitations (e.g., acceptable voltage ranges, breakdown voltages and current limitations) while also providing significant ESD protection ratings.

The processes discussed in connection with the various figures provide example implementations consistent with embodiments of the present invention. Variations on these processes and the resulting structures are contemplated. As such, the invention is not limited to the specific processes or structures depicted in the figures and can include variations and combinations thereof. For example, although several embodiments are discussed that use polysilicon resistors, the invention is not necessarily so limited. Other resistor types are also possible including, but not limited to, metal and semiconductor resistors.

Example package outlines consistent with embodiments of the present invention include Small-Outline Transistor Package (SOT), Plastic Small-Outline Package (PSOP), Thin Small-Outline Package (TSOP), Shrink Small-Outline Package (SSOP) and Thin-Shrink Small Outline Package (TSSOP); consistent with industry standards (JEDEC/EIAJ). The invention, however, is not so limited and can be implemented using a variety of other form factors including future form factors.

Accordingly, while the present invention has been described above and in the claims that follow, those skilled in the art will recognize that many changes may be made thereto without departing from the spirit and scope of the present invention.

The invention claimed is:

1. A resistor-equipped transistor comprising:
a package providing an external collector connection node, an external emitter connection node and an external base connection node and containing:
a substrate having an epitaxial layer and supporting
a transistor having an internal collector, an internal emitter and an internal base;
a first resistor electrically connected between the internal base and the external base connection node;
a second resistor electrically connected between the internal base and the internal emitter;
a first diode having a cathode and an anode; and
a second diode having a cathode and an anode, the first and second diodes electrically coupled in series between the external base connection node and the external collector connection node with the first diode in a first cathode-anode orientation that is opposite of a second cathode-anode orientation corresponding to the second diode,
wherein the substrate includes a first region within a first part of the epitaxial layer to form either a common anode or a common cathode of the first and second diodes, and includes a second part of the epitaxial layer on the first part,
wherein a further region is within the epitaxial layer to form the internal base of the transistor, and
wherein the emitter of the transistor is formed by an implanted third region in the further region.

2. The transistor of claim 1, wherein the transistor has a collector-emitter breakdown voltage and a collector-base breakdown voltage and wherein the first diode and second diode are configured with breakdown voltages higher than the collector-emitter breakdown voltage and the collector-base breakdown voltage, and wherein the substrate is of a first conductivity type, the first part of the epitaxial layer is of the first conductivity type, and the first region is of a second conductivity type that is opposite of the first conductivity type.

3. The transistor of claim 1, wherein the first and second diode are part of a floating-base transistor, and the internal base of the transistor is formed by a second region of the second conductivity type within the epitaxial layer.

4. The transistor of claim 1, wherein the first resistor and the second resistor are polysilicon resistors and wherein the substrate is a doped silicon substrate.

5. The transistor of claim 1, wherein the package is a surface mount device (SMD) package.

6. The transistor of claim 1, wherein the transistor is a vertical NPN transistor and wherein the transistor further includes a p+well located between the vertical NPN transistor and the first and second diodes for inhibiting leakage current therebetween.

7. The transistor of claim 1, wherein the transistor is a vertical PNP transistor and wherein the transistor further includes an n+ well located between the vertical PNP transistor and the first and second diodes for inhibiting leakage current therebetween.

8. The transistor of claim 1, wherein the first diode and the second diode are implanted layers within an epitaxially-grown layer on the substrate.

9. A method of manufacturing a device that includes a resistor-equipped transistor, the method comprising:
on a substrate of a first conductivity type, growing an epitaxial layer of the first conductivity type to form a collector of the transistor, one of the substrate and the epitaxial layer forming either a cathode or an anode of a first diode;
implanting and diffusing at least a first region within the epitaxial layer to form either a common anode or a common cathode of the first diode and of a second diode and to form an internal base of the transistor, the at least first region being of a second conductivity type that is opposite of the first conductivity type;
implanting and diffusing a second region of the first conductivity type within either the implanted first region or the epitaxial layer to form either a cathode or an anode of the second diode;
implanting and diffusing a third region of the first conductivity type to form an emitter of the transistor;
forming an oxide layer on the grown epitaxial layer and the implanted regions;
depositing material with a high-sheet resistance on the oxide layer to form first and second resistors, the first resistor electrically connected between the second region and the internal base of the transistor and the second resistor electrically connected between the internal base of the transistor and the emitter of the transistor; and
electrically connecting the second region, the emitter of the transistor, and the collector of the transistor to respective bond pads, and wherein a further region of the second conductivity type is formed within the epitaxial layer to form the internal base of the transistor.

10. The method of claim 9, further comprising packaging the resistor-equipped transistor in a surface-mount device (SMD) package.

11. The method of claim 9, wherein the step of implanting and diffusing the at least a first region includes implanting two separate regions of the second conductivity type within the epitaxial layer, the first region forming either the common anode or the common cathode of the first and second diodes and a further region forming the internal base of the transistor, and wherein the substrate forms either the cathode or the anode of the first diode and the emitter of the transistor is formed by implanting and diffusing the third region in the further region.

12. The method of claim 9, wherein the step of implanting and diffusing the at least a first region includes implanting only the first region in the epitaxial layer, the first region forming either the common anode or the common cathode of the first and second diodes and forming the internal base of the transistor, and wherein the epitaxial layer forms either the cathode or the anode of the first diode and the emitter of the transistor is formed by implanting and diffusing the third region in the first region.

13. The method of claim 12, further comprising implanting and diffusing a fourth region of the second conductivity type within the implanted first region to form an isolation well that is located between the implanted second region and the implanted third region.

14. The method of claim 9, wherein the steps of growing the epitaxial layer and implanting and diffusing the at least first region include
growing a first part of the epitaxial layer on the substrate,
implanting and diffusing the first region within the first part of the epitaxial layer to form either the common anode or the common cathode of the first and second diodes,
after implanting and diffusing the first region, growing a second part of the epitaxial layer on the first part, and
after growing the second part of the epitaxial layer, the further region is formed by implanting and diffusing the further region of the second conductivity type within the epitaxial layer to form the internal base of the transistor, and
wherein the emitter of the transistor is formed by implanting and diffusing the third region in the further region.

15. The method of claim 9, wherein the resistor-equipped transistor is an NPN resistor-equipped transistor, the first conductivity type is n type, the second conductivity type is p type, one of the substrate and the epitaxial layer form the cathode of the first diode, the first region forms the common anode of the first and second diodes, and the second region forms the cathode of the second diode.

16. The method of claim 9, wherein the resistor-equipped transistor is an PNP resistor-equipped transistor, the first conductivity type is p type, the second conductivity type is n type, one of the substrate and the epitaxial layer form the anode of the first diode, the first region forms the common cathode of the first and second diodes, and the second region forms the anode of the second diode.

17. A method of manufacturing a device that includes a resistor-equipped transistor, the method comprising:
on a substrate of a first conductivity type, growing a first part of an epitaxial layer of the first conductivity type to form a collector of the transistor, the substrate forming either a cathode or an anode of a first diode;
implanting and diffusing a first region within the first part of the epitaxial layer to form either a common anode or a common cathode of the first diode and of a second diode, the first region being of a second conductivity type that is opposite of the first conductivity type;
after implanting and diffusing the first region, growing a second part of the epitaxial layer on the first part, and
after growing the second part of the epitaxial layer, implanting and diffusing a second region of the second conductivity type within the epitaxial layer to form an internal base of the transistor;
implanting and diffusing a third region of the second conductivity type within the epitaxial layer to form isolation of the second diode;
implanting and diffusing a fourth region of the first conductivity type within the epitaxial layer to form either a cathode or an anode of the second diode;
implanting and diffusing a fifth region of the first conductivity type within the implanted second region to form an emitter of the transistor;
forming an oxide layer on the grown epitaxial layer and the implanted regions;
depositing material with a high-sheet resistance on the oxide layer to form first and second resistors, the first resistor electrically connected between the fourth region and the internal base of the transistor and the second resistor electrically connected between the internal base of the transistor and the emitter of the transistor; and
electrically connecting the fourth region, the emitter of the transistor, and the collector of the transistor to respective bond pads.

18. The method of claim 17, wherein the step of implanting and diffusing a second region and the step of implanting and diffusing a third region are performed in a single processing step.

19. The method of claim 17, wherein the step of implanting and diffusing a fourth region and the step of implanting and diffusing a fifth region are performed in a single processing step.

20. The method of claim 17, wherein further comprising packaging the resistor-equipped transistor in a surface-mount device (SMD) package.

* * * * *